(12) United States Patent
Suenobu

(10) Patent No.: US 8,982,275 B2
(45) Date of Patent: Mar. 17, 2015

(54) IMAGING APPARATUS

(75) Inventor: Kazuhiko Suenobu, Sakura (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/884,355

(22) PCT Filed: Nov. 10, 2011

(86) PCT No.: PCT/JP2011/075968
§ 371 (c)(1),
(2), (4) Date: Aug. 26, 2013

(87) PCT Pub. No.: WO2012/063912
PCT Pub. Date: May 18, 2012

(65) Prior Publication Data
US 2013/0342745 A1  Dec. 26, 2013

(30) Foreign Application Priority Data

Nov. 10, 2010  (JP) .................................. 2010-251980

(51) Int. Cl.
*H04N 3/14* (2006.01)
*H04N 5/225* (2006.01)
*H04N 5/335* (2011.01)
*H01L 27/146* (2006.01)

(52) U.S. Cl.
CPC .......... *H04N 5/335* (2013.01); *H01L 27/14618* (2013.01)
USPC .......................................... 348/374; 348/321

(58) Field of Classification Search
USPC ........................... 348/294, 302, 308, 321, 323
See application file for complete search history.

(56) References Cited

U.S. PATENT DOCUMENTS

| | | | | |
|---|---|---|---|---|
| 4,709,259 A | * | 11/1987 | Suzuki | 348/280 |
| 8,451,360 B2 | * | 5/2013 | Nakamura et al. | 348/308 |
| 8,582,009 B2 | * | 11/2013 | Kono et al. | 348/302 |
| 8,717,471 B2 | * | 5/2014 | Sato | 348/294 |
| 2009/0322917 A1 | * | 12/2009 | Kyogoku et al. | 348/273 |
| 2010/0096677 A1 | * | 4/2010 | Inoue | 257/294 |
| 2010/0271523 A1 | * | 10/2010 | Hara | 348/302 |
| 2012/0098081 A1 | * | 4/2012 | Horiike et al. | 257/443 |

FOREIGN PATENT DOCUMENTS

JP  B-4373690  11/2009

OTHER PUBLICATIONS

Dec. 6, 2011 International Search Report issued in International Application No. PCT/JP2011/075968 (with translation).
Dec. 6, 2011 Written Opinion issued in International Application No. PCT/JP2011/075968 (with translation).

* cited by examiner

*Primary Examiner* — Timothy J Henn
(74) *Attorney, Agent, or Firm* — Oliff PLC

(57) ABSTRACT

An imaging apparatus includes a solid-state imaging element and a substrate. The solid-state imaging element includes a pixel array having a plurality of pixels in a two-dimensional matrix and pads that correspond to pixel columns of the pixel array and output signals of pixels in the pixel columns. Signal output terminal groups having a plurality of pads arranged in a line in a column direction of the pixel array are arranged in a row direction of the pixel array. A substrate includes a laminated wire being a laminate of a plurality of wiring layers and provided for each of the signal output terminal groups to extend in the column direction of the pixel array. The laminated wire includes a first terminal portion at a position facing each pad in the signal output terminal group. The pad and first terminal portion are connected to each other by a bump.

4 Claims, 8 Drawing Sheets

IMAGING APPARATUS

TECHNICAL FIELD

The present invention relates to an imaging apparatus which captures an image of an object.

Priority is claimed on Japanese Patent Application No. 2010-251980, filed Nov. 10, 2010, the content of which is incorporated herein by reference.

BACKGROUND

In recent years, a large sensor chip which is used in, for example, a so-called digital single-lens reflex camera has been required to operate at a high speed. A/D converters are provided for each column of a pixel array provided on the same chip and perform signal processing in parallel, which makes it possible to reduce the processing speed of the A/D converters to a relatively small value and thus reduce power consumption. However, in order to improve the processing speed, a sensor unit with low noise, a wide dynamic range, and a high power supply voltage, and a digital circuit which includes a micro transistor and operates at a very high speed at a low power supply voltage are configured to be incorporated into one chip. Therefore, the manufacturing process becomes complicated and the yield is reduced. In addition, when a high-speed operation is performed, the amount of heat generated from the chip, particularly, from the A/D converter increases, and an adverse effect, such as a reduction in image quality, due to an increase in temperature is likely to occur in the pixel array.

In some cases, in order to shield the transmission of heat from the A/D converter to the pixel array and improve the yield, a so-called multi-chip mounting structure is used in which the signal processing unit including the A/D converter and the pixel array are formed by individual chips and are mounted on one glass chip.

A structure has become known in which a laminated wire obtained by alternately laminating a plurality of leads and insulating layers is connected to the solid-state imaging element which is used in the imaging apparatus, such as a digital still camera (for example, see Patent Document 1). The laminated wire and the solid-state imaging element are connected to each other by wire bonding.

CITATION LIST

Patent Literature

[Patent Document 1] Japanese Patent No. 4373690

SUMMARY

Technical Problem

In the imaging apparatus such as a digital still camera, it is required to increase the number of pixels in the pixel array. In the related art, the signal lines of the solid-state imaging element extending from the pixel array are provided in parallel in the column direction. Therefore, when the width of the solid-state imaging element is constant, a space for arranging pad portions with a width more than that of the signal line is insufficient with an increase in the number of pixels.

In addition, it is necessary to form electrodes for connection to the solid-state imaging element or the signal processing chip on, for example, printed wires on a substrate which connect the solid-state imaging element and the signal processing chip. There is a limitation in increasing the density of the printed wires. In contrast, for example, when the laminated wire is used to connect the solid-state imaging element and the signal processing chip, it is possible to increase the density of the wires. However, when the pad of the solid-state imaging element is connected to the laminated wire by wire bonding, it is necessary to arrange the pad and the laminated wire so as to be separated from each other in the horizontal direction for the wire bonding and a certain space needs to be formed between the laminated wires.

While, when the pad of the solid-state imaging element and the laminated wire are connected to each other by a via connection method using a through hole, the width of, for example, a land or the like, which is a via-connected portion, increases.

Therefore, it is difficult to increase the number of laminated wires, without an increase in the size of the solid-state imaging element or the substrate.

An object of aspects of the present invention is to provide an imaging apparatus capable of ensuring a space for arranging a pad portion of a solid-state imaging element, increasing the density of laminated wires, and increasing the number of pixels in a pixel array, without an increase in the size of the solid-state imaging element or a substrate.

Solution to Problem

According to an aspect of the invention, an imaging apparatus includes: a solid-state imaging element including a pixel array in which a plurality of pixels are arranged in a two-dimensional matrix and signal output terminals which are provided so as to correspond to pixel columns of the pixel array and output signals of pixels in the pixel columns, a plurality of signal output terminal groups, each of which includes a plurality of the signal output terminals arranged in a line in a column direction of the pixel array, being arranged in a row direction of the pixel array; and a substrate including a laminated wire which is a laminate of a plurality of wiring layers and is provided for each of the signal output terminal groups so as to extend in the column direction of the pixel array. The laminated wire includes a first terminal portion which is provided at a position facing each signal output terminal in the signal output terminal group. The signal output terminal and the first terminal portion are connected to each other by a bump.

Advantages

According to the aspect of the invention, since the signal output terminal groups each of which includes a plurality of signal output terminals arranged in the column direction of the pixel array are arranged in the row direction of the pixel array, the signal output terminals can be arranged such that the gap therebetween is more than that between the pixel columns of the pixel array. Therefore, it is possible to increase the number of signal output terminals arranged in the same width range as that in the solid-state imaging element of the imaging apparatus according to the related art.

In addition, the signal output terminal of the solid-state imaging element is arranged so as to face the first terminal portion of the laminated wire, and the signal output terminal and the first terminal portion are connected to each other by the bump. Therefore, it is possible to reduce the size of the connection portion, as compared to wire bonding or via connection using the through hole. As a result, it is possible to increase the number of laminated wires arranged in the same width range and thus increase the density of the laminated wires.

Therefore, it is possible to ensure a space for arranging the signal output terminals of the solid-state imaging element and increase the density of wires, while preventing an increase in the width of the solid-state imaging element or the substrate. Therefore, it is possible to increase the number of pixels in the pixel array.

DESCRIPTION OF EMBODIMENTS

Hereinafter, an imaging apparatus according to an embodiment of the present invention will be described with reference to the accompanying drawings.

Figure 1:
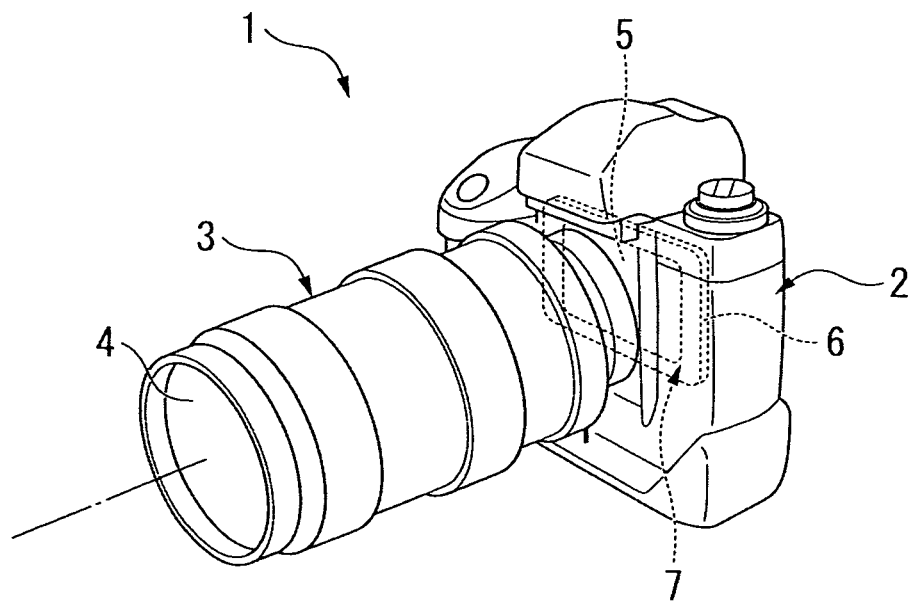
FIG. 1 is a perspective view illustrating an imaging apparatus according to an embodiment.

FIG. 1 shows an imaging apparatus 1 according to this embodiment. The imaging apparatus 1 is a so-called digital single-lens reflex camera. In the imaging apparatus 1, a lens barrel 3 is removably attached to a lens mount (not shown) of a camera body 2 and light which passes through a lens 4 of the lens barrel 3 is focused on a sensor chip (solid-state imaging element) 5 of a multi-chip module 7 arranged on the rear surface of the camera body 2. The sensor chip 5 is, for example, a bare chip of a so-called CMOS image sensor.

Figure 2:
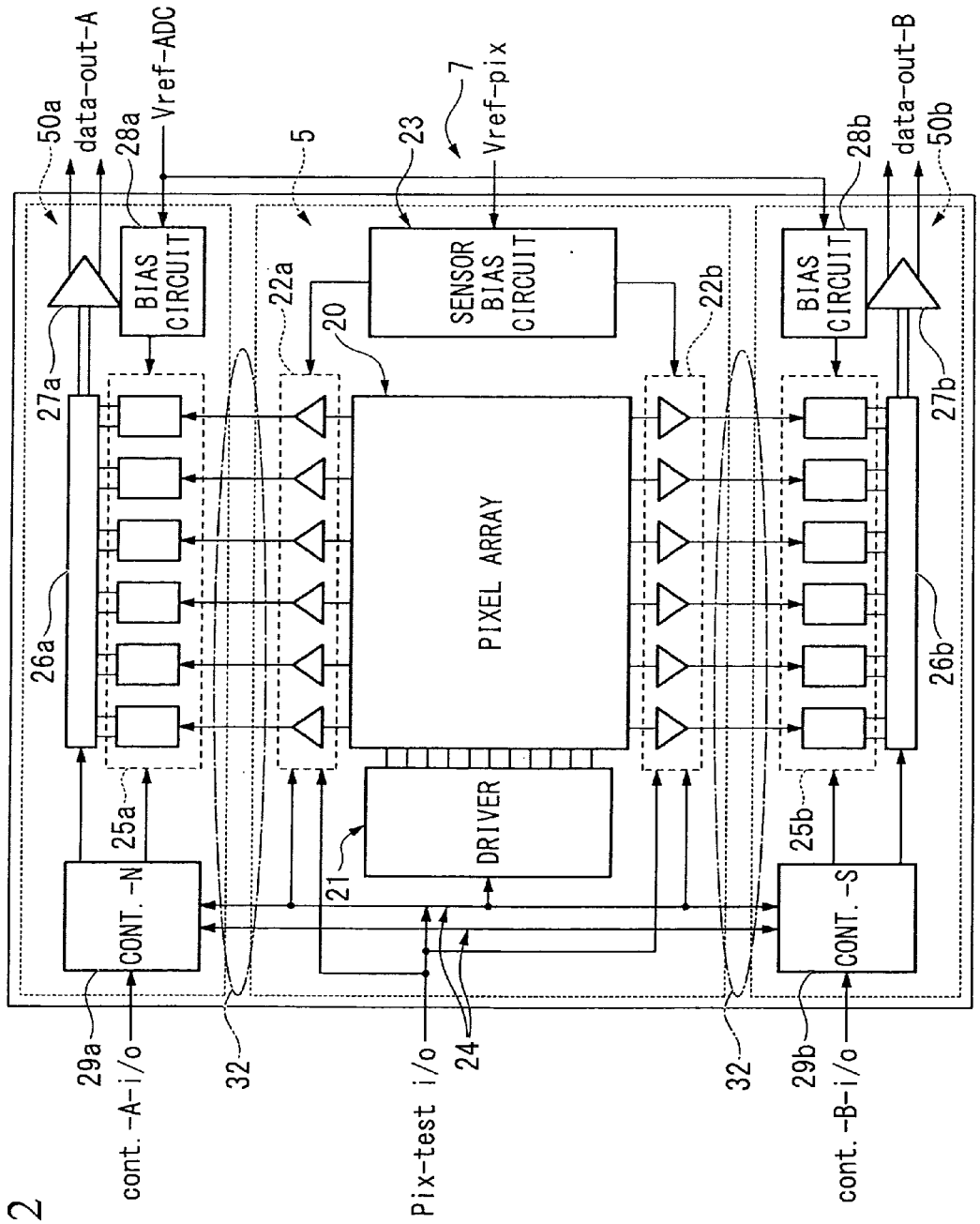
FIG. 2 is a block diagram illustrating the schematic structure of the imaging apparatus according to the embodiment.

As shown in FIG. 2, the multi-chip module 7 includes the sensor chip 5, an upper signal processing chip 50a, and a lower signal processing chip 50b.

The sensor chip 5 includes a pixel array 20 in which a plurality of pixels which output signals (hereinafter, simply referred to as pixel signals) corresponding to incident light are two-dimensionally arranged in a lattice shape along the column direction and the row direction, a pixel driver 21 which drives the pixel array 20, two column pre-amplifiers 22a and 22b which amplify an output from the pixel array 20, and a sensor bias circuit 23 which mainly supplies bias reference voltage and current to the column pre-amplifiers 22a and 22b of the sensor chip 5 on the basis of a control signal (Vref-pix) from the outside. The sensor chip 5 further includes a driving control bus 24 for the pixel driver 21. The driving control bus 24 is connected to the upper signal processing chip 50a and the lower signal processing chip 50b.

Of the column pre-amplifiers 22a and 22b, the column pre-amplifier 22a amplifies pixel signals of each of the odd-numbered columns of the pixel array 20 in parallel and outputs the amplified pixel signals to the upper signal processing chip 50a. The column pre-amplifier 22b amplifies pixel signals of each of the even-numbered columns of the pixel array 20 in parallel and outputs the amplified pixel signals to the lower signal processing chip 50b.

The upper signal processing chip 50a is a signal processing circuit which processes an input signal and includes a plurality of analog digital converters (hereinafter, simply referred to as column ADCs) 25a which convert analog electric signals for each column output from the column pre-amplifier 22a of the sensor chip 5 into digital signals in parallel, a digital output bus 26a for the digital signal output from the column ADCs 25a, a digital small-amplitude differential output circuit 27a which reduces the amplitude of the signal from the digital output bus 26a and differentially transmits (data-out-A) the signal to the outside of the chip, a bias circuit 28a for the column ADCs 25a, and a control circuit (CONT.-N) 29a which controls the column ADCs 25a, the digital output bus 26a, the digital small-amplitude differential output circuit 27a, and the bias circuit 28a.

Similarly, the lower signal processing chip 50b is a signal processing circuit which processes an input signal and includes a plurality of column ADCs 25b which convert analog electric signals for each column output from the column pre-amplifier 22b of the sensor chip 5 into digital signals in parallel, a digital output bus 26b for the digital signal output from the column ADCs 25b, a digital small-amplitude differential output circuit 27b which reduces the amplitude of the signal from the digital output bus 26b and differentially transmits (data-out-B) the signal to the outside of the chip, a bias circuit 28b for the column ADCs 25b, and a control circuit (CONT.-S) 29b which controls the column ADCs 25b, the digital output bus 26b, the digital small-amplitude differential output circuit 27b, and the bias circuit 28b.

A control signal (Pix-test i/o) for testing the operation of the multi-chip module 7 can be input to the control circuits 29a and 29b, the pixel driver 21, and the column pre-amplifiers 22a and 22b from the outside.

Next, the operation of the multi-chip module 7 having the above-mentioned chip structure will be described. The description of an operation in the operation test will be omitted.

First, control signals are input to the multi-clip module 7 from the outside through two control lines (which are represented by 'cont.-A-i/o' and 'cont.-B-i/o' in FIG. 2). Then, the control signals are input to the pixel driver 21 through the driving control bus 24 by at least one of the control circuit 29a of the upper signal processing chip 50a and the control circuit 29b of the lower signal processing chip 50b. Then, the pixel driver 21 drives the pixel array 20 and the pixel signals for each selected row are input to the column pre-amplifiers 22a and 22b for each column in parallel. The pixel signals input to the column pre-amplifiers 22a and 22b are amplified at a necessary gain and are then output from the sensor chip 5. The pixel signals output from the sensor chip 5 are input to each of the upper signal processing chip 50a and the lower signal processing chip 50b through laminated wires 32 (wires indicated in FIG. 2 by surrounding with a one-dot chain line) (which will be described below) which are formed in the column direction.

The upper signal processing chip 50a and the lower signal processing chip 50b have the same structure and the same operation except that one of them receives the output signals from the even-numbered columns of the pixel array 20 while the other receives the output signals from the odd-numbered columns of the pixel array 20. Therefore, hereinafter, only the upper signal processing chip 50a will be described and the description of the lower signal processing chip 50b will be omitted.

Figure 3:
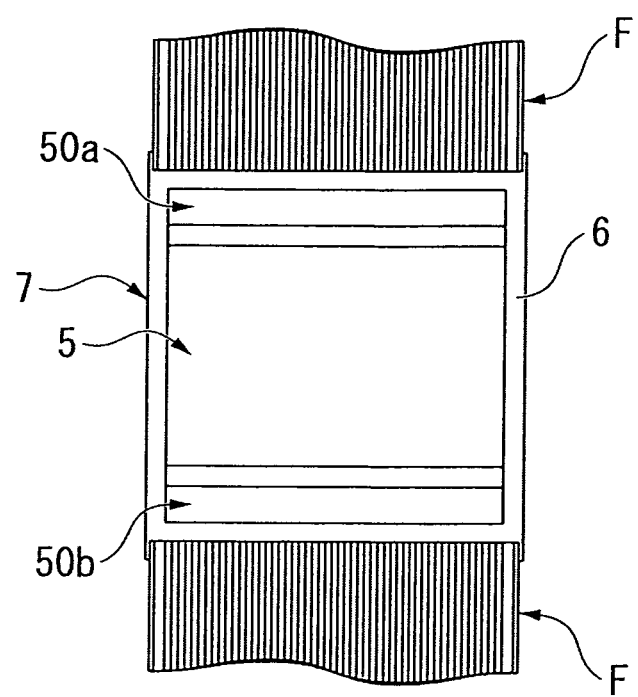
FIG. 3 is a front view illustrating a multi-chip module according to the embodiment.

The pixel signals input to the upper signal processing chip 50a are input to the column ADCs 25a for each column in parallel and are analog-digital converted into digital pixel signals on the basis of the control signal from the control circuit 29a. The analog-digital converted digital pixel signals are input to the digital small-amplitude differential output circuit 27a through the digital output bus 26a on the basis of the control signal from the control circuit 29a. The amplitude of the digital pixel signals is reduced and the digital pixel signals are differentially output (represented by 'data-out-A' in FIG. 2). Here, the digital pixel signals ('data-out-A' and 'data-out-B') are output from the upper signal processing chip 50a and the lower signal processing chip 50b in a predetermined order. The digital pixel signals output from the upper signal processing chip 50a and the lower signal processing chip 50b are transmitted to the outside of the multi-chip module 7 through a flexible printed circuit board F (see FIG. 3).

In the above description, the digital small-amplitude differential output circuits 27a and 27b are provided in the upper signal processing chip 50a and the lower signal processing chip 50b, respectively. Alternatively, a plurality (a plurality of lanes) of digital small-amplitude differential output circuits 27a to 27n may be provided according to a necessary pixel output speed and an output order may be changed by the control circuit 29a or the control circuit 29b to transmit the digital pixel signals. In the above description, the column ADCs 25a and 25b perform only analog-digital conversion. Alternatively and/or additionally, the column ADCs 25a and 25b may include a signal processing circuit which performs an advanced digital operation, if necessary, and perform a process of adding the offset value of data, a process of reducing and correcting fixed pattern noise (FPN), and a process of correcting a variation in error for each of the column ADCs 25a and 25b.

The multi-chip module 7 is a COG-type (Chip On Glass type) module in which the sensor chip 5, the upper signal processing chip 50a, and the lower signal processing chip 50b are directly mounted on a glass substrate 6 in a bare chip mounting manner. The sensor chip 5 is, for example, a relatively large sensor chip with a so-called full size of 35 mm or the like and is attached with a light receiving surface 8 facing the glass substrate 6.

The glass substrate 6 is formed in, for example, a transparent plate with a substantially rectangular shape in which the longitudinal direction is the column direction of the pixel array 20 (see FIG. 2). The sensor chip 5 is mounted substantially at the center of the glass substrate 6 in the longitudinal direction. In addition, the upper signal processing chip 50a and the lower signal processing chip 50b are each formed in a substantially rectangular shape along the width direction of the glass substrate 6 in a top view. The upper signal processing chip 50a is mounted on the upper side of the sensor chip 5 in the longitudinal direction of the glass substrate 6 and the lower signal processing chip 50b is mounted on the lower side of the sensor chip 5 in the longitudinal direction of the glass substrate 6.

Figure 4:
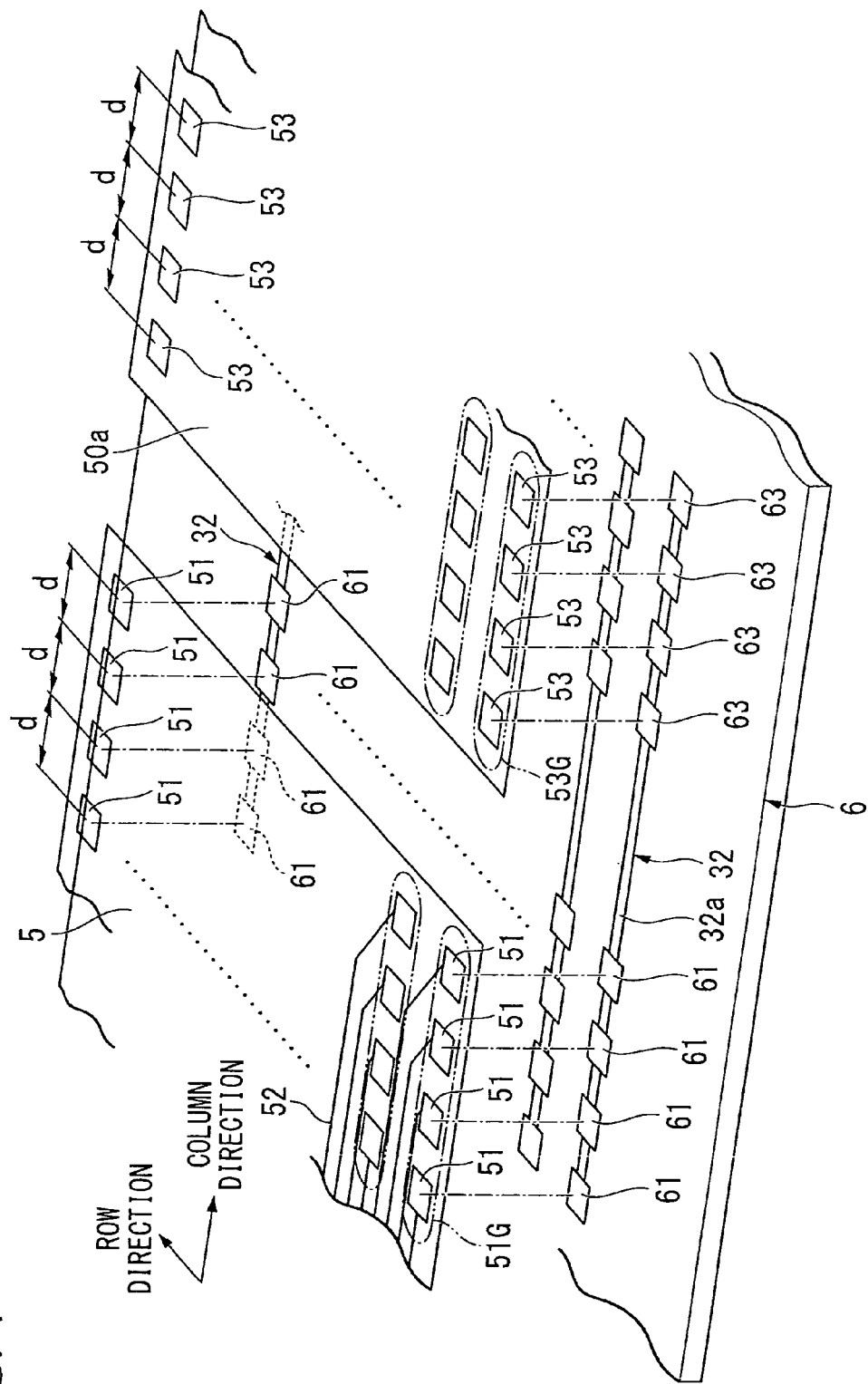
FIG. 4 is a diagram illustrating the arrangement and connection relationship between a pad and a first connection portion and between a pad and a second connection portion in the embodiment.

FIG. 4 shows the connection structure between the sensor chip 5 and the upper signal processing chip 50a of the multi-chip module 7. The connection structure between the sensor chip 5 and the lower signal processing chip 50b is the same as that between the sensor chip 5 and the upper signal processing chip 50a, and the description thereof will be omitted.

As shown in FIG. 4, a plurality of signal lines 52 which are connected to each pixel column of the pixel array 20 are arranged substantially in parallel in the sensor chip 5. A pad 51, which is a signal output terminal, is formed at the end of the signal line 52. The pad 51 has a substantially rectangular shape with a width larger than that of the signal line 52 and is exposed from the lower surface of the sensor chip 5.

A plurality of (for example, four) pads 51 are arranged in the column direction of the pixel array 20 with a gap d therebetween. A set of the plurality of pads 51 forms a signal output terminal group 51G. A plurality of sets of the signal output terminal groups 51G are arranged in the row direction of the pixel array 20. The number of sets of the signal output terminal groups 51G is a value obtained by dividing the number of signal lines 52 by the number of pads 51 provided in each signal output terminal group 51G. That is, the signal output terminal groups 51G can be arranged in the row direction of the pixel array 20 at an interval which is a value obtained by multiplying the pitch between the pixels in the pixel column by the number of pads 51 in each signal output terminal group 51G.

Similarly, pads 53 which are exposed from the lower surface of the upper signal processing chip 50a are formed in the upper signal processing chip 50a at positions which are symmetrical to the pads 51 provided at the edge of the sensor chip 5. Each pad 53 is connected to the column ADC 25a through a signal line (not shown). A plurality of (for example, four) pads 53 are arranged in the column direction of the pixel array 20, with the gap d therebetween. A set of the plurality of pads 53 forms a signal input terminal group 53G. A plurality of sets of the signal input terminal groups 53G are arranged in the row direction of the pixel array 20.

Next, the gap between the pixels on the sensor chip 5 and the gap between the signal lines will be described.

Figure 6A:
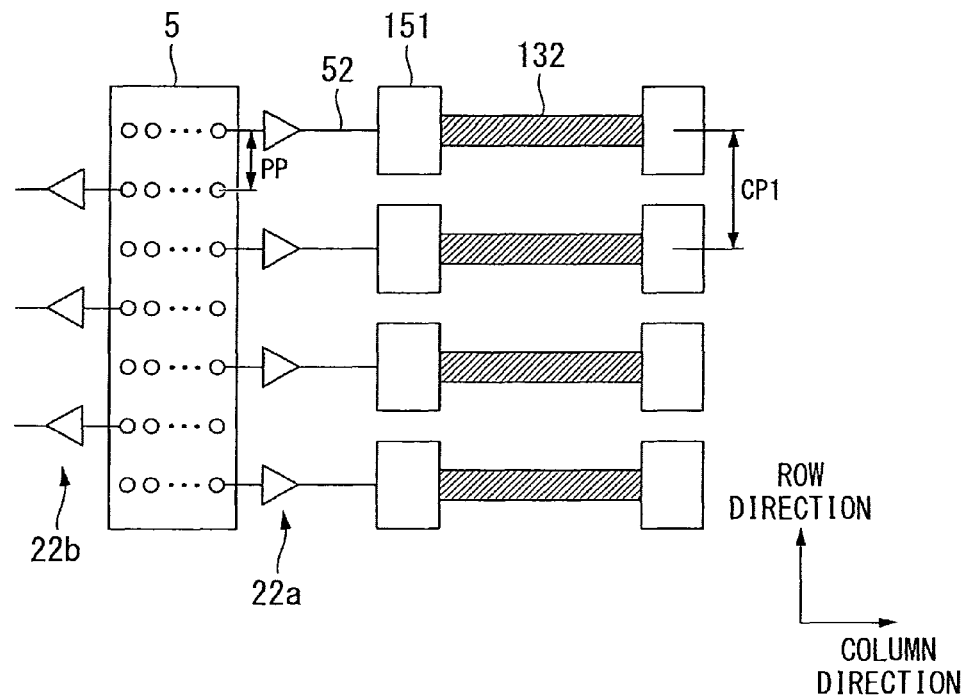
FIG. 6A is a diagram illustrating the gap between connection terminals in an imaging apparatus according to the related art and shows single-column arrangement.
Figure 6B:
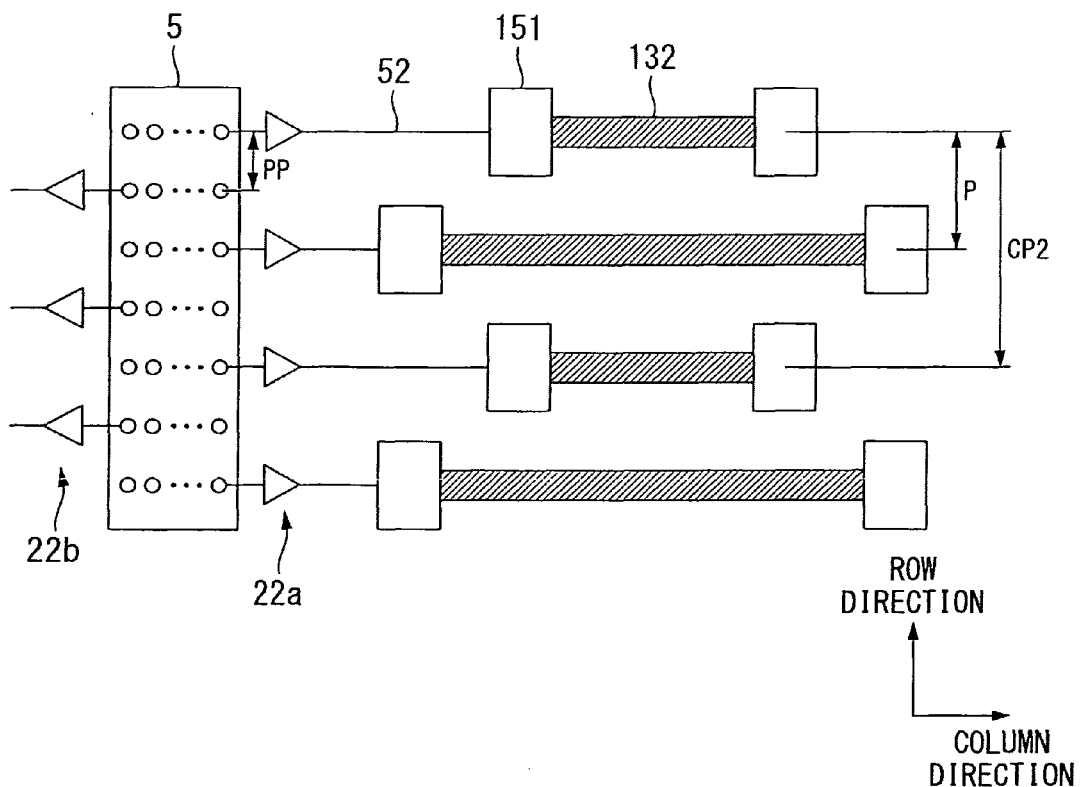
FIG. 6B is a diagram illustrating the gap between connection terminals in an imaging apparatus according to the related art and shows zigzag arrangement.

FIGS. 6A and 6B show the gap between the pixels on the sensor chip according to the related art and the gap between the signal lines 52. In FIGS. 6A and 6B, the pixel provided in the pixel array 20 is represented by '◯' and the pixel pitch in the row direction of the pixel array 20 is represented by 'PP' (similarly shown in FIG. 7). Each pixel outputs a signal to the signal line 52 arranged in the column direction.

FIG. 6A shows a 'single-column arrangement' type in which connection terminals 151 of the sensor chip 5 are arranged in parallel in the row direction, similarly to the signal lines 52, and are arranged at the same position in the column direction. In the case of the 'single-column arrangement' type, the direction in which the signal is output from the odd-numbered pixel column is opposite to the direction in which the signal is output from the even-numbered pixel column and the number of signals output in the same direction is half the number of all signals output in only one direction. Therefore, a gap distance CP1 between the connection terminals 151 can be made to be two times more (2PP) than the pixel pitch. In addition, reference numeral 132 indicates a wiring pattern on the glass substrate 6 which is connected to the connection terminal 151.

On the other hand, FIG. 6B shows a 'zigzag arrangement' type in which the connection terminals 151 shown in FIG. 6A are arranged to be alternately displaced in the column direction. In the case of the 'zigzag arrangement' type, a gap distance CP2 between the connection terminals 151 which are adjacent to each other in the row direction can be made to be four times (4PP) more than the pixel pitch and it is possible to ensure the gap distance that is two times more than that in the 'single-column arrangement' type. The lower limit of the gap distance CP1 or the gap distance CP2 between the connection terminals 151 is restricted depending on the limit of the accuracy of adjusting and arranging the glass substrate 6 and the sensor chip 5 provided on the glass substrate 6 at predetermined positions. In addition, the lower limit of the pitch between the pixels arranged on the pixel array 20 of the sensor chip 5 is restricted by the limit of the accuracy of a semiconductor manufacturing process.

Figure 7:
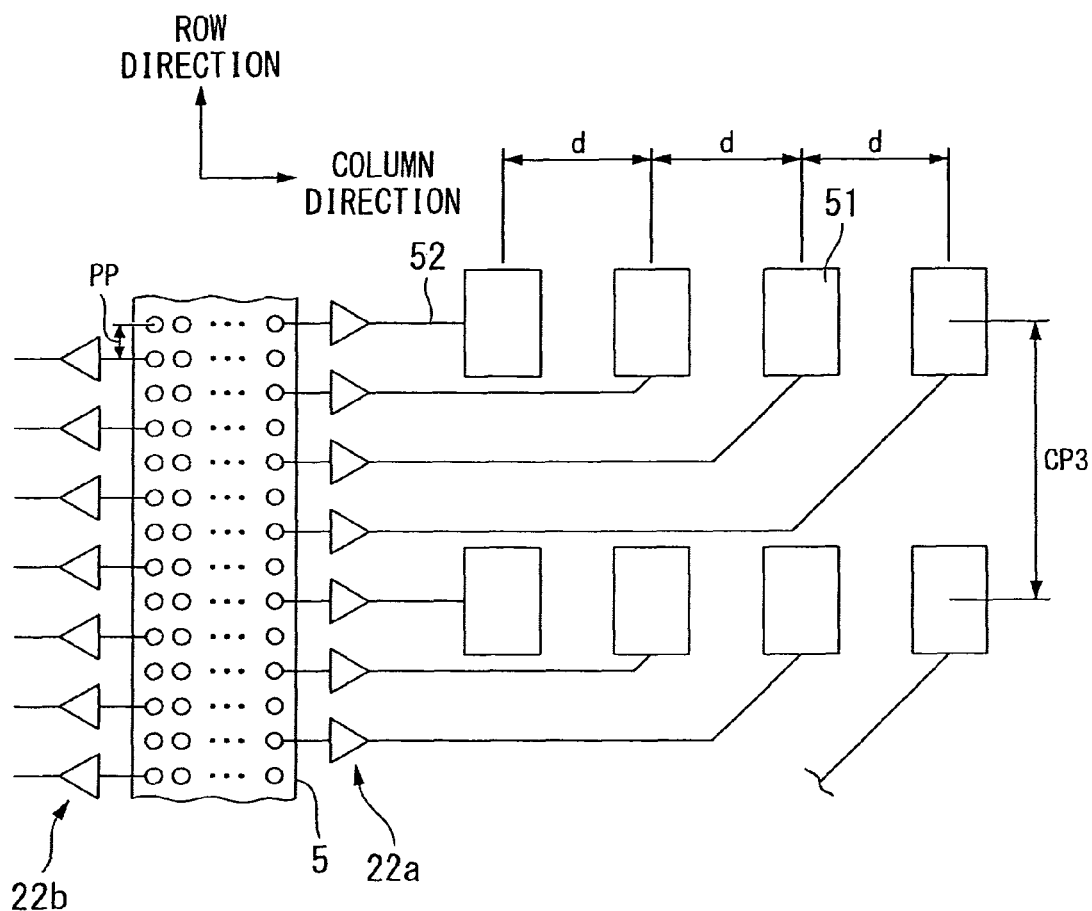
FIG. 7 is a diagram corresponding to FIGS. 6A and 6B in the embodiment.

In contrast, as shown in FIG. 7, in the imaging apparatus 1 according to this embodiment, the direction in which the signal is output from the odd-numbered column is opposite to the direction in which the signal is output from the even-numbered column in the pixel array 20 and four pads 51 are arranged in the column direction with the gap d therebetween. Therefore, the gap distance CP3 between the pads 51 in the row direction can be made to be eight times (=2×4) (8PP) more than the pixel pitch.

As shown in FIG. 4, first terminal portions 61, which are electrodes, are formed on the upper surface of the glass substrate 6 at positions facing each pad 51 of the sensor chip 5 so as to be exposed from the upper surface of the glass substrate 6. In addition, second terminal portions 63, which are electrodes, are formed on the upper surface of the glass substrate 6 at positions facing each pad 53 of the upper signal processing chip 50a so as to be exposed from the upper surface of the glass substrate 6. The first terminal portion 61 and the second terminal portion 63 form a portion of the laminated wire 32. The pad 51 and the pad 53 are electrically connected to each other by the laminated wire 32. In FIG. 4, for convenience of illustration, bumps 9 which are interposed between the pad 51 and the first terminal portion 61 and between the pad 53 and the second terminal portion 63 are not shown. In addition, for convenience of illustration, the gap between the glass substrate 6 and the upper signal processing chip 50a and the gap between the glass substrate 6 and the sensor chip 5 are enlarged.

Next, the connection configuration between the sensor chip 5 and the upper signal processing chip 50a will be described with reference to FIGS. 5A and 5B. The connection configuration between the sensor chip 5 and the upper signal processing chip 50a is the same as that between the sensor chip 5 and the lower signal processing chip 50b. Therefore, only the connection configuration between the sensor chip 5 and the upper signal processing chip 50a will be described.

Figure 5A:
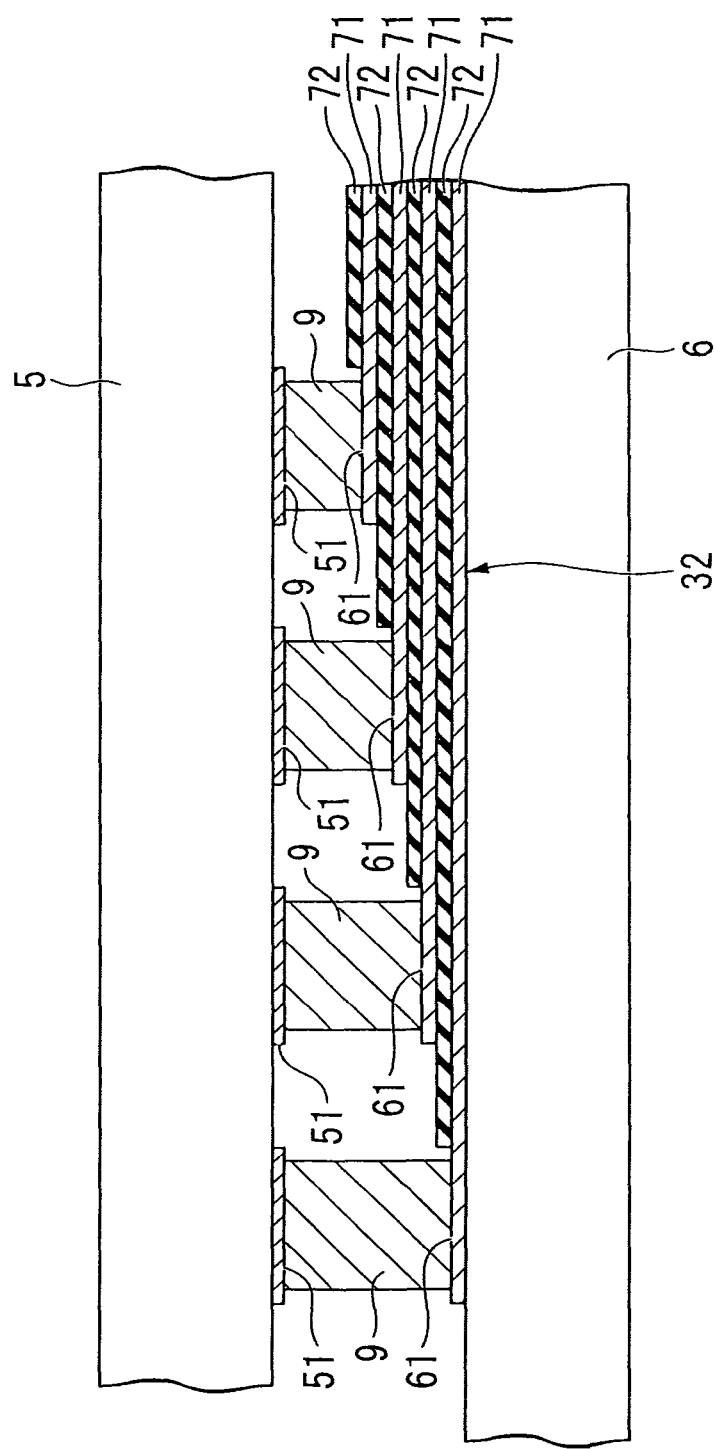
FIG. 5A is an enlarged side view schematically illustrating the connection state between a sensor chip and an upper signal processing chip in the embodiment and a connection portion between the sensor chip and a laminated wire.

FIG. 5A shows a connection portion between the pad 51 and the first terminal portion 61. The laminated wire 32 is formed by alternately laminating a plurality of wiring layers 71 which are made of a conductor and a plurality of insulating layers 72 which are made of an insulating material. Specifically, the laminated wire 32 is formed by alternately laminating four wiring layers 71 whose number is equal to the number of pads 51 in one signal input terminal group 53G and four insulating layers 72 which are provided between the wiring layers 71. The end of the laminated wire 32 is formed in a step shape such that the upper surfaces of the ends of each wiring layer 71 and each insulating layer 72 are alternately exposed. An exposed portion of the end of the wiring layer 71 is the first terminal portion 61 and is formed to have a width that is slightly more than that of a body portion 32a of the laminated wire 32.

In the case of via connection, the length of one side of the terminal portion is at least about 50 μm. In contrast, the first terminal portion 61 can be formed such that the length of one side is about 30 μm. In this embodiment, it is possible to effectively use a space, as compared to via connection. For example, it is possible to reduce the gap between the laminated wires 32, or it is possible to increase the width of the wire to reduce resistance.

The first terminal portions 61 and the pads 51 which are arranged so as to face the first terminal portions 61 are connected to each other by the bumps 9 with different heights. The bump 9 is a so-called micro bump which is made of a metal material, such as Au, and a thermo-compression process using, for example, a flip chip bonder (not shown) is performed for the bump 9 to electrically connect the pad 51 and the first terminal portion 61 which face each other. The material forming the bump 9 is not limited to the metal material, but, for example, a resin bump may be used. In addition, for example, a plated bump or a stud bump may be used as the bump 9.

The first terminal portion 61 which is provided in the lowermost layer of the laminated wire 32 is bonded by the bump to the innermost pad 51 of the sensor chip 5 in the column direction. Since the gap between the first terminal portion 61 provided in the lowermost layer and the pad 51 is the largest, the height of the bump 9 which connects the first terminal portion 61 and the pad 51 is the largest. The first terminal portion 61 provided in the second lowermost layer of the laminated wire 32 is bonded by the bump to the second innermost pad 51 of the sensor chip 5 in the column direction. Similarly, the first terminal portion 61 provided in the higher layer of the laminated wire 32 is bonded by the bump to the more outer pad 51 of the sensor chip 5 in the column direction. At that time, as the layer in which the first terminal portion 61 is provided becomes higher, the gap between the first terminal portion 61 and the pad 51 is reduced. Therefore, in accordance with the increase in the thickness of the layer, the height of the bump 9 is sequentially reduced.

Figure 5B:
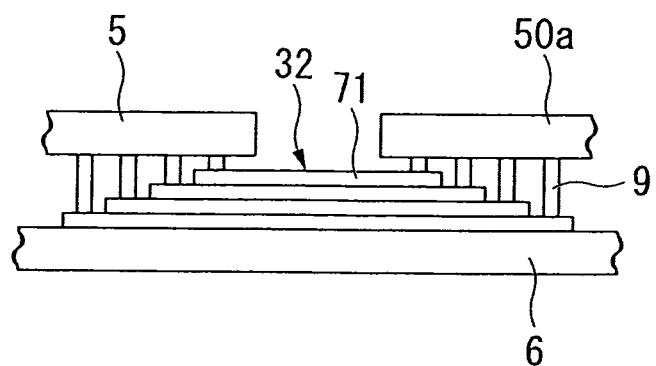
FIG. 5B is a side view schematically illustrating the connection state between the sensor chip and the upper signal processing chip in the embodiment and the connection state of wiring layers.

As shown in FIG. 5B, in an embodiment, the uppermost wiring layer 71 connects the pad 51 of the sensor chip 5 and the pad 53 of the upper signal processing chip 50a which are arranged with the closest gap therebetween. The second wiring layer 71 from the upper side connects the pad 51 and the pad 53 which are arranged with the second closest gap therebetween. Similarly, the third wiring layer 71 from the upper side connects the pad 51 and the pad 53 which are arranged with the third closest gap therebetween and the lowermost wiring layer 71 from the upper side connects the pad 51 and the pad 53 which are furthest away from each other. For convenience of illustration, the insulating layer 72 is not shown in FIG. 5B.

Therefore, according to the imaging apparatus of the above-described embodiment, in the sensor chip 5, the signal output terminal groups 51G, each having the plurality of pads 51 arranged in the column direction of the pixel array 20, are arranged in the row direction of the pixel array 20. Therefore, the pads 51 can be arranged such that the gap therebetween is more than the gap between the pixel columns of the pixel array 20. As a result, it is possible to increase the number of pads 51 arranged in the same width range as that of the sensor chip of the imaging apparatus according to the related art.

Moreover, in this embodiment, the pads 51 of the sensor chip 5 and the first terminal portions 61 of the laminated wire 32 are arranged so as to face each other and are bonded to each other by the bumps. Therefore, it is possible to reduce the size of the connection portion, as compared to wire bonding or via connection using a through hole. As a result, it is possible to increase the number of laminated wires 32 in the same width range as that in the related art and thus increase the density of the laminated wires 32.

Therefore, in this embodiment, it is possible to ensure a space for arranging the pads 51 of the sensor chip 5 and increase the density of the laminated wires 32, while preventing an increase in the width of the sensor chip 5 or the glass substrate 6. Therefore, it is possible to increase the number of pixels in the pixel array 20.

In addition, in this embodiment, similarly in the upper signal processing chip 50a and the lower signal processing chip 50b, the signal input terminal groups 53G; each having the plurality of pads 53 arranged in the column direction, are arranged in the row direction. Therefore, the pads 53 can be arranged such that the gap distance therebetween is more than the gap distance between the pixel columns. As a result, it is possible to prevent an increase in the size of the upper signal processing chip 50a and the lower signal processing chip 50b.

Furthermore, in this embodiment, the pads 53 of the upper signal processing chip 50a and the lower signal processing chip 50b are arranged so as to face the second terminal portions 63 of the laminated wires 32, and the pads 53 and the second terminal portions 63 are bonded to each other by the bumps. Therefore, it is possible to reduce the size of each of the pads 51 and 61, the first connection portion 53, and the second terminal portion 63, as compared to wire bonding or via connection using a through hole. As a result, it is possible to increase the number of laminated wires 32 arranged in the same width range as that in the related art and thus increase the density of the laminated wires 32.

The invention is not limited to the structure of the above-described embodiment, but the design can be changed without departing from the scope of the invention.

For example, in the above-described embodiment, an example of the multi-chip mounting structure in which the sensor chip 5, the upper signal processing chip 50a, and the lower signal processing chip 50b are individually formed has been described. However, the invention can be applied to a case in which the sensor chip 5 including the upper signal processing chip 50a and the lower signal processing chip 50b formed integrally therewith is mounted on the glass substrate 6.

Moreover, in the above-described embodiment, a case where the sensor chip 5 is mounted on the glass substrate 6 has been described. However, the substrate on which the sensor chip 5 is mounted is not limited to the glass substrate 6, but may be, for example, a silicon substrate or an interposer.

In addition, in the above-described embodiment, a case where the imaging apparatus 1 is a digital single-lens reflex camera has been described. However, the imaging apparatus is not limited to the digital single-lens reflex camera, but the invention can be applied to, for example, an imaging apparatus, such as a video camera or a digital compact camera.

The substrate is not limited to the glass substrate 41, but a transparent substrate other than the glass substrate may be used.

DESCRIPTION OF REFERENCE SYMBOLS

5: SENSOR CHIP (SOLID-STATE IMAGING ELEMENT)
6: GLASS SUBSTRATE (SUBSTRATE)
9: BUMP
20: PIXEL ARRAY
51: PAD (SIGNAL OUTPUT TERMINAL)
51G: SIGNAL OUTPUT TERMINAL GROUP
61: FIRST TERMINAL PORTION
63: SECOND TERMINAL PORTION
32: LAMINATED WIRE
71: WIRING LAYER

The invention claimed is:

1. An imaging apparatus comprising:
a solid-state imaging element that includes a pixel array in which a plurality of pixels are arranged in a two-dimensional matrix and signal output terminals which are provided so as to correspond to pixel columns of the pixel array and output signals of pixels in the pixel columns, a plurality of signal output terminal groups, each of which includes a plurality of the signal output terminals arranged in a line in a column direction of the pixel array, being arranged in a row direction of the pixel array; and
a substrate including a laminated wire which is a laminate of a plurality of wiring layers and is provided for each of the signal output terminal groups so as to extend in the column direction of the pixel array, and
wherein the laminated wire includes first terminal portions which are each provided at a position facing each signal output terminal in the signal output terminal group, and
wherein a plurality of bumps each connect one of the signal output terminals to a corresponding one of the first terminal portions.

2. The imaging apparatus according to claim 1, further comprising:
a signal processing chip that processes a signal output from the solid-state imaging element,
wherein the signal processing chip includes a connection terminal which is connected to the signal output terminal by the laminated wire,
the laminated wire includes a second terminal portion which is provided at a position facing the connection terminal of the signal processing chip, and
the connection terminal and the second terminal portion are connected to each other by one of the plurality of bumps.

3. The imaging apparatus according to claim 1, wherein the plurality of bumps comprise stud bumps.

4. The imaging apparatus according to claim 1, wherein the plurality of bumps comprise plated bumps.

* * * * *